United States Patent
Zheng et al.

(10) Patent No.: US 10,469,035 B2
(45) Date of Patent: Nov. 5, 2019

(54) AMPLIFIER USING PARALLEL HIGH-SPEED AND LOW-SPEED TRANSISTORS

(71) Applicant: Newport Fab, LLC, Newport Beach, CA (US)

(72) Inventors: Jie Zheng, Mission Viejo, CA (US); Samir Chaudhry, Irvine, CA (US); Edward J. Preisler, San Clemente, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 15/923,195

(22) Filed: Mar. 16, 2018

(65) Prior Publication Data

US 2019/0288648 A1    Sep. 19, 2019

(51) Int. Cl.
| | | |
|---|---|---|
| *H03F 3/68* | (2006.01) | |
| *H03F 1/26* | (2006.01) | |
| *H01L 29/10* | (2006.01) | |
| *H01L 29/08* | (2006.01) | |
| *H01L 27/082* | (2006.01) | |
| *H01L 27/02* | (2006.01) | |
| *H01L 29/732* | (2006.01) | |

(Continued)

(52) U.S. Cl.
CPC .......... *H03F 1/26* (2013.01); *H01L 27/0207* (2013.01); *H01L 27/088* (2013.01); *H01L 27/0825* (2013.01); *H01L 29/0804* (2013.01); *H01L 29/0821* (2013.01); *H01L 29/0847* (2013.01); *H01L 29/1004* (2013.01); *H01L 29/1033* (2013.01); *H01L 29/732* (2013.01); *H03F 3/195* (2013.01); *H04B 1/16* (2013.01); *H03F 2200/294* (2013.01); *H03F 2200/451* (2013.01)

(58) Field of Classification Search
CPC ............. H03F 3/68; H03F 3/191; H03F 3/193
USPC ............................ 330/124 R, 126, 295, 302
See application file for complete search history.

(56) References Cited

U.S. PATENT DOCUMENTS

| | | | |
|---|---|---|---|
| 7,915,959 B2 * | 3/2011 | Shibata | ................... H03F 3/211 330/277 |
| 2004/0089877 A1 | 5/2004 | Zheng et al. | |

(Continued)

*Primary Examiner* — Steven J Mottola
(74) *Attorney, Agent, or Firm* — Bever, Hoffman & Hams, LLP

(57) ABSTRACT

A single-stage amplifier circuit includes first and second transistors (e.g., BJTs or FETs) connected in parallel between the amplifier's input and output nodes. The first and second transistors are configured differently using known fabrication techniques such that a (first) cutoff frequency of the first transistor is at least 1.5 times greater than a (second) cutoff frequency of the second transistor, and such that a ratio of the respective cutoff frequencies produces a significant cancellation of second derivative transconductance (Gm") in the amplifier output signal, whereby the amplifier achieves significantly improved IIP$_3$. Alternatively, the amplifier is configured using MOSFETs having respective different channel lengths to achieve the desired cutoff frequency ratio. An exemplary communication circuit includes a low-noise amplifier having two NPN BJTs that are fabricated using different collector doping concentrations, different emitter doping concentrations, or different base region widths in order to achieve the desired cutoff frequency ratio.

17 Claims, 5 Drawing Sheets

(51) Int. Cl.
*H03F 3/195* (2006.01)
*H04B 1/16* (2006.01)
*H01L 27/088* (2006.01)

(56) References Cited

U.S. PATENT DOCUMENTS

2009/0127585 A1   5/2009   U'ren
2009/0149213 A1   6/2009   Zwingman et al.
2015/0303187 A1   10/2015  Preisler et al.

* cited by examiner

AMPLIFIER USING PARALLEL HIGH-SPEED AND LOW-SPEED TRANSISTORS

FIELD OF THE INVENTION

This invention relates generally to amplifiers, and more particularly to low-noise amplifiers utilized in communication circuits.

BACKGROUND OF THE INVENTION

An amplifier is an electronic circuit that can increase the power of a received input signal (e.g., a time-varying voltage or current). Each amplifier uses electric power from a power supply to increase the amplitude of a relatively weak input signal in order to generate a relatively strong (amplified) output signal, where the amount of amplification determines the amplifier's gain (i.e., the ratio of output signal voltage, current, or power to input signal voltage, current, or power). Amplifiers can either be separate stand-alone devices, or electrical circuits implemented as part of an integrated semiconductor device.

The quality of an amplifier circuit is often determined by measuring the signal-to-noise ratio of the amplifier circuit's output signal. Along with the desired amplified input signal, each amplifier circuit also outputs noise, which is an unwanted disturbance in the (electrical) output signal that may preclude accurate detection of the desired input signal by downstream circuitry. Noise generated by electronic devices varies greatly as it is produced by several different effects. In communication systems, noise can produce errors or undesired random disturbances of useful information (i.e., the input signal). Signal-to-noise ratio (abbreviated SNR or S/N) is a measure that compares the level of the desired amplified input signal to the level of noise that is transmitted with the amplified input signal. S/N ratio is defined as the ratio of signal power to the noise power, and is typically expressed in decibels (dB), which is calculated using a ratio of the root mean square signal power to the root means square noise power at the amplifier output, and then multiplying the log (base 10) of the ratio value by twenty. Circuit designers strive to minimize a circuit's S/N ratio by way of considering various trade-offs that include impedance matching, choosing a suitable amplifier technology (such as low-noise components), and selecting low-noise biasing conditions.

A low-noise amplifier (LNA) is an electronic amplifier circuit that is often utilized in various integrated circuits to amplify extremely weak and uncertain signal (e.g., received from an antenna), often on the order of microvolts or under −100 dBm (dB referenced vs. 1 mW of power), and amplify it to a more useful level (e.g., about one-half to one volt). LNAs are used in communication devices (e.g., a radio communications system or a cellular telephone), medical instruments and electronic equipment in which the weak input signals that are just above the noise floor. Ideally, LNAs function to capture and amplify very low-power, low-voltage input signals that are within a bandwidth of interest, and to filter out all random background noise that may be received with the input signals. In practice, the detection and removal of all background noise under these conditions, which is known in the art as the unknown signal/unknown noise challenge, is the most difficult of all signal-processing challenges, and current LNA technologies are only able to reduce (i.e., not fully eliminate) background noise generated in the output signal.

LNAs are typically compared based on three primary parameters: noise figure, gain, and linearity (power consumption and efficiency are typically not primary concerns). The noise figure (NF) of an LNA is a measure of degradation of the S/N ratio caused by thermal (and other) effects on components in a radio-frequency (RF) signal chain, where most LNA typically have NF values in the 0.5 to 1.5 dB range. Typical gain is between 10 and 20 dB for a single stage LNA. While providing gain itself is not a major challenge with modern electronics, it is severely compromised by any noise that the LNA may add to the weak input signal, which can overwhelm any benefits of the amplification that the LNA adds. Linearity refers to the relationship between input signal strength and output signal strength, where an amplifier's linearity is determined by how closely the output signal strength varies in direct proportion to the input signal strength. Nonlinearity in an LNA is caused by the resultant harmonics and intermodulation distortion that can corrupt the received input signal, and make demodulation and decoding with a sufficiently low error rate more difficult. Linearity is usually characterized by the third-order intercept point ($IIP_3$), which relates nonlinear products caused by the third-order nonlinear term to the linearly amplified signal; the higher the $IIP_3$ value, the more linear the amplifier performance.

Various circuit design level techniques have been used in an attempt to produce LNAs exhibiting improved linearization (i.e., increased $IIP_3$), including inductive source degeneration and multi-gated-transistor linearization. However, there are several disadvantages to addressing LNA linearization using these conventional circuit design level approaches. First, these approaches require additional biasing circuits and devices, which increase the complicacy of the LNA circuit and overall chip size, thereby increasing manufacturing costs by reducing production yields. In addition, these approaches increase the total current consumed by the LNA during operation, and reduce the LNA's power gain. Moreover, these approaches increase RF noise, which reduces the LNA's NF value.

What is needed is an amplifier circuit that achieves improved linearity and avoids the disadvantages of conventional linearization approaches. In particular, what is needed is an amplifier circuit that achieves significant $IIP_3$ improvement without a significant reduction in transducer power gain.

SUMMARY OF THE INVENTION

The present invention is directed to a novel single-stage amplifier circuit that achieves enhanced linearity and extremely low noise output by way of applying the unamplified input signal to the control terminal of both transistors, and by combining the output currents from two or more parallel-connected transistors (e.g., two NPN bipolar junction transistors (BJTs) or two n-channel metal-oxide semiconductor field-effect transistors (MOSFETs or FETs), where the two transistors are fabricated using different configurations that collectively function to substantially reduce or cancel configured second derivative transconductance (Gm"), which results in a significant $IIP_3$ improvement (e.g., 13 dBm) over similarly configured amplifier circuits with comparable single transistors or two identical transistors. The two transistors are characterized by different construction techniques that yield different electrical properties such as cutoff frequency ($F_T$), where the cutoff frequency of a transistor refers to the frequency at which the transistor's gain is unity (i.e., there is no amplification at a frequency greater than $F_T$). According to an aspect of the present invention, a "high-speed" (first) transistor of the two transistors is configured using a first set of feature characteristics that produce a higher (first) cutoff frequency, and a "low-speed" (second) transistor is configured with a second set of feature characteristics that produce a lower (second) cutoff frequency that is one-third (33%) or more lower than the higher cutoff frequency (i.e., such that a ratio of the higher cutoff frequency to the lower cutoff frequency is 1.5:1 or higher), where at least one feature characteristic of the second set is different from at least one characteristic of the first set and produces the cutoff frequency difference. For example, using arbitrary cutoff frequency values, if the high-speed transistor is configured by way of a first feature characteristic set to have a higher cutoff frequency of approximately 150 GHz, then the low-speed transistor is configured by way of a second feature characteristic set to have a lower cutoff frequency of approximately 100 GHz or less. The inventors discovered that, by utilizing the parallel-connected transistors having respective cutoff frequencies that differ by approximately one-third or more, the novel amplifier circuit achieves a beneficial reduction of second derivative transconductance (Gm"), thereby achieving improved $IIP_3$ without a significant reduction in transducer power gain. Although the mechanism by which the beneficial reduction of second derivative transconductance is not entirely understood at this time, it is believed that fabricating the two transistors with cutoff frequencies that differ by one-third or more causes the two transistors to respectively generate second order harmonics that are roughly 180° out of phase with each other, whereby combining the output signals from the two transistors results in significant cancellation of these second order harmonics.

In a presently preferred embodiment, the two transistors are configured such that a ratio of the higher cutoff frequency to the lower cutoff frequency is in the range of 1.5:1 to 20:1, and more preferably in the range of 2:1 to 5:1. By fabricating the parallel-connected transistors with respective cutoff frequencies that differ in these ranges, the inventors have verified that the novel amplifier circuit achieves a significant $IIP_3$ improvement (e.g., 13 dBm or more) over similarly configured amplifier circuits with comparable transistors having the same cutoff frequency.

According to a practical embodiment, the novel single-stage amplifier circuit is implemented using two parallel-connected NPN BJTs having respective base regions connected to the amplifier input node, respective collector regions connected to the amplifier output node and to a system voltage source by way of a resistive element, and respective emitter regions either connected directly to ground, or coupled to ground via an inductor and/or current source. In one specific embodiment, the higher and lower cutoff frequencies are achieved by fabricating the high-speed BJT with a first n-type collector doping level that is greater than a second n-type collector doping level of the low-speed BJT (e.g., such that a ratio of the first collector doping level to the second collector doping level is in the range of 1.5:1 to 1000:1, preferably 10:1 or greater). In another specific embodiment, the higher and lower cutoff frequencies are achieved by fabricating the high-speed BJT with a first n-type emitter doping level that is greater than a second n-type emitter doping level of low-speed BJT (e.g., such that a ratio of the first emitter doping level to the second doping level is 2:1 or greater). In yet another specific embodiment, the higher and lower cutoff frequencies are achieved by fabricating the high-speed BJT with a first base width that is less than a second base width of the low-speed BJT (e.g., such that a ratio of the second base width to the first base width is 2:1 or greater).

According to another embodiment, the novel single-stage amplifier circuit is implemented using two parallel-connected n-channel MOSFETs having respective gate structures connected to the amplifier input node, respective drain regions connected to the amplifier output node and to a system voltage source by way of a resistive element, and respective source regions coupled to ground. In one specific embodiment, the higher and lower cutoff frequencies are achieved by fabricating the high-speed FET with a first channel length that less than a second channel length of the low-speed n-channel FET (e.g., such that the second channel length is at least 10% greater than the first channel length).

According to another practical embodiment of the present invention, the novel amplifier 100C is further modified using bias control circuitry to apply bias voltages onto the control terminal of least one of the two transistors in order to optimize the gain, noise and linearity of the amplifier. In one embodiment, bias control network circuits are coupled between the amplifier input node and the control terminals of the two transistors, with the bias control circuits operably configured to apply associated bias voltages onto the respective control terminals. In alternative embodiments, the same bias voltage is applied to both transistors, or different bias voltages are applied to the two transistors. In yet another embodiment, bias control network circuits are respectively coupled between the emitter terminals of the two transistors and ground.

According to another practical embodiment of the present invention, a communication circuit is fabricated with a low-noise amplifier (LNA) circuit that is configured in accordance with the novel aspects set forth above.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to improved amplifier circuits and to communication circuits that utilize the improved amplifier circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

In physics and electrical engineering, a cutoff frequency, corner frequency, or break frequency is a boundary in a system's frequency response at which energy flowing through the system begins to be reduced (attenuated or reflected) rather than passing through. For BJTs and MOSFETs, the cutoff frequency refers to the frequency at which the ratio of the output AC current to the AC input current is unity (i.e., one to one). For amplifiers configured using BJTs or MOSFETs, the term "cutoff frequency" refers to a frequency limit of an applied input signal below which the applied input signal is amplified by the amplifier, and above which the applied input signal is attenuated by the amplifier.

The transconductance (Gm) of a transistor refers to the transistors' ability to transform voltage at its control terminal (e.g., gate/base) to current at the transistor's output (e.g., drain/collector), the larger the transconductance figure for a transistor, the greater the gain (amplification) it is capable of delivering, when all other factors are held constant. The first derivative of a transistor's transconductance (Gm') provides the rate of change $dI_{out}/dV_{CNTRL}$ of the output current, and the second derivative (Gm") measures how quickly the rate of change $dI_{OUT}/dt$ of the output current changes over time.

Figure 1:
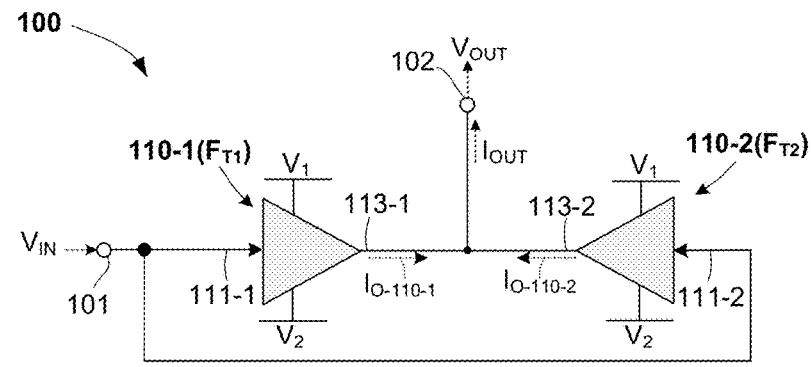
FIG. 1 is a simplified circuit diagram showing an amplifier circuit configured in accordance with a generalized embodiment of the present invention.
Figure 2A:
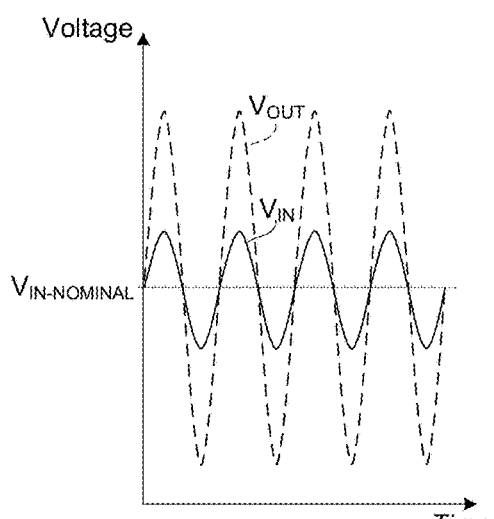
FIGS. 2A, 2B and 2C are graphs depicting exemplary operating characteristics of the amplifier circuit of FIG. 1 during operation.
Figure 2B:
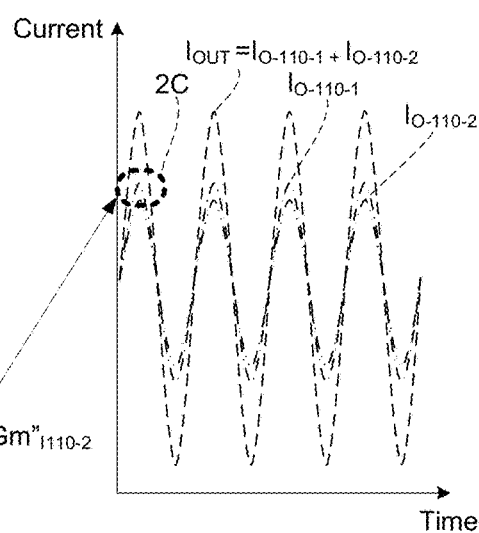

FIG. 1 shows a low-noise or other amplifier circuit 100 for generating an amplified output signal (i.e., $V_{OUT}$ and/or $I_{OUT}$) on an output node 102 in response to an unamplified input signal $V_{IN}$ received at an input node 101. A relationship between the amplified output signal and unamplified input signal is depicted in exemplary form in FIG. 2A, which shows amplified output signal $V_{OUT}$ superimposed over unamplified input signal $V_{IN}$, where amplified output signal $V_{OUT}$ is produced with the same frequency as unamplified input signal $V_{IN}$, but has a greater amplitude. Amplifier circuit 100 generally includes a first transistor 110-1 and a second transistor 110-2 that are connected in parallel between input node 101 and output node 102. Specifically, first transistor 110-1 includes a first control terminal 111-1 coupled to input node 101 and a first output terminal 113-1 coupled to output node 102, and second transistor 110-2 includes a second control terminal 111-2 coupled to input node 101 and a second output terminal 113-2 coupled to output node 102. Both first transistor 110-1 and second transistor 110-2 are coupled to a high (first) voltage source V1 (e.g., 5V) and a low (second) voltage source V2 (e.g., ground or 0V). With this parallel configuration, unamplified input signal $V_{IN}$ is applied both to control terminal 111-1 of transistor 110-1 and to control terminal 111-2 of transistor 110-2, whereby first transistor 110-1 generates an amplified output current $I_{O-110-1}$ in response to unamplified input signal $V_{IN}$, and second transistor 110-2 generates an amplified output current $I_{O-110-2}$ that is also generated in response to unamplified input signal $V_{IN}$. As indicated in FIG. 1, both output currents $I_{O-110-1}$ and $I_{O-110-2}$ are passed to output node 102, whereby, as depicted in FIG. 2B, both output currents $I_{O-110-1}$ and $I_{O-110-2}$ combined to form amplifier output current $I_{OUT}$, which may be utilized to generate an output voltage $V_{OUT}$ at output node 102.

Figure 2C:
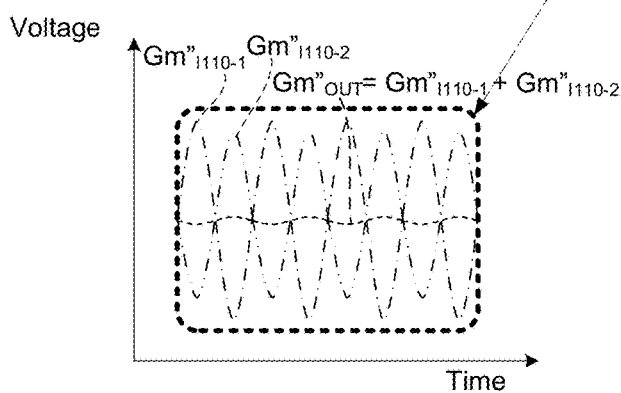

Referring again to FIG. 1, according to an aspect of the present invention, both transistor 110-1 and transistor 110-2 are fabricated using different configurations (i.e., different sets of characteristic features, such as the different fabrication and construction features described below) such that "high-speed" (first) transistor 110-1 has a higher (first) cutoff frequency $F_{T1}$ that is at least 1.5 times greater than a lower (second) cutoff frequency $F_{T2}$ of "low-speed" (second) transistor 110-2. For example, using arbitrary cutoff frequency values, if transistor 110-1 is configured by way of a first feature characteristic set to have a cutoff frequency $F_{T1}$ of approximately 150 GHz, then transistor 110-2 would be configured by way of a second feature characteristic set such that its cutoff frequency $F_{T2}$ would be approximately 100 GHz or less (i.e., such that the ratio $F_{T1}:F_{T2}$ is approximately 1.5:1). The inventors discovered that, by forming amplifier circuit 100 using parallel-connected transistors 110-1 and 110-2 having respective higher/lower cutoff frequencies that differ by approximately one-third or more, amplifier circuit 100 achieves improved $IIP_3$ without a significant reduction in transducer power gain. Although the mechanism by which the beneficial reduction of second derivative transconductance is not entirely understood at this time, it is believed that fabricating transistors 110-1 and 110-2 such that cutoff frequencies $F_{T1}$ and $F_{T2}$ differ by one-third or more causes the offset/cancellation of second order harmonics in the manner depicted in FIG. 2C, thereby reducing the second order harmonic in the amplifier output signal. Specifically, due to the difference between cutoff frequencies $F_{T1}$ and $F_{T2}$, transistor 110-1 generates output signal $I_{O-110-1}$ with a second order harmonic $Gm''_{I110-1}$ that is roughly 180° out of phase with the second order harmonic $Gm''_{I110-2}$ in output signal $I_{O-110-2}$ generated by transistor 110-2. Accordingly, by constructing amplifier circuit 100 such that transistors 110-1 and 110-2 exhibit a cutoff frequency ratio $F_{T1}$ to $F_{T2}$ in the range of 1.5:1 to 20:1 (and more preferably in the range of 2:1 to 5:1), and by configuring amplifier circuit 100 such that output currents $I_{O-110-1}$ and $I_{O-110-2}$ are combined at output node 102, amplifier circuit 100 achieve improved $IIP_3$ without a significant reduction in transducer power gain by way of the significant cancellation of second order harmonics $Gm''_{I110-1}$ and $Gm''_{I110-2}$ in the amplifier output signal (i.e., $V_{OUT}$ and/or $I_{OUT}$).

Figure 3A:
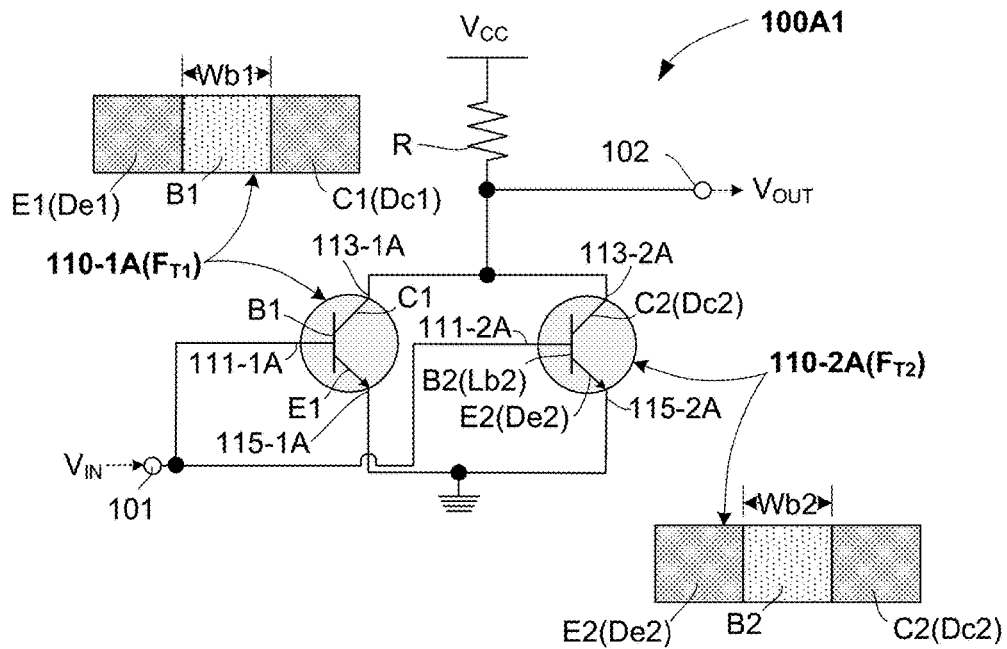
FIGS. 3A and 3B are simplified circuit diagram showing BJT-based amplifiers configured in accordance with specific embodiments of the present invention.
Figure 3B:
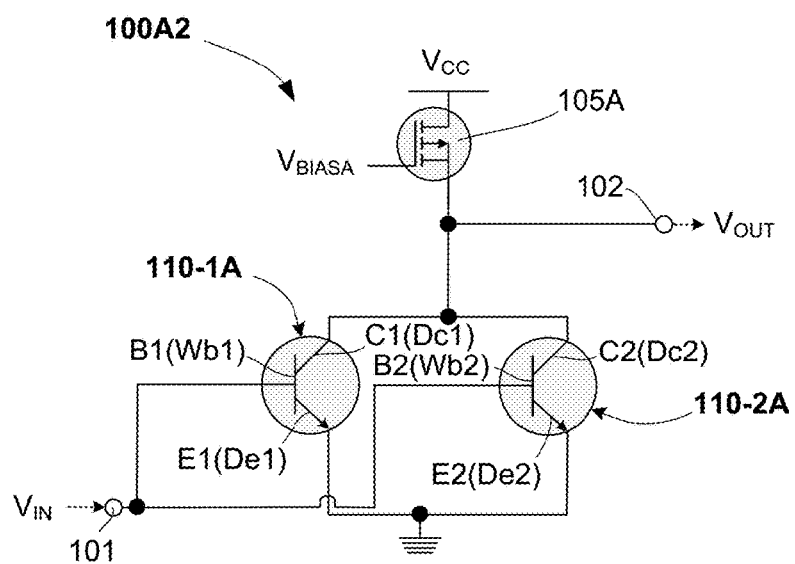

FIGS. 3A and 3B depict BJT-based amplifier circuits 100A1 and 100A2 according to alternative exemplary specific embodiments of the present invention in which the two transistors of amplifier circuit 100 (FIG. 1) are implemented by npn BJTs 110-1A and 110-2A. In both embodiments, BJT 110-1A includes a (first) p-doped base region B1 connected by way of first control terminal 111-1A to input node 101, a (first) n-doped collector region C1 connected by way of the first output terminal 113-1A to output node 102, and a (first) n-doped emitter region C1 coupled to a ground (second) voltage source. BJT 110-2A includes a (second) p-doped base region B1 connected by way of second control terminal 111-2A to input node 101, a (second) n-doped collector region C2 connected by way of second output terminal 113-2A to output node 102, and a (second) n-doped emitter region C2 coupled to ground (i.e., either connected directly to ground as shown, or coupled to ground by way of at least one of an inductor and a current source, not shown).

As set forth above, BJT 110-1A and BJT 110-2A of both amplifier circuits 100A1 and 100A2 are fabricated using different feature set configurations such that cutoff frequency $F_{T1}$ of high-speed BJT 110-1A is at least 1.5 times cutoff frequency $F_{T2}$ of low-speed BJT 110-2A. The different feature set configurations are implemented by constructing (fabricating) at least one feature of BJT 110-1A using a fabrication process parameter (e.g., a doping process and/or mask configuration) that differs from that used to construct at least one corresponding feature of BJT 110-2A. Referring to the cross-sectional depictions that are respectively provided in the upper left and lower right portions of FIG. 3A, exemplary feature set configurations for BJT 110-1A may include collector doping concentrations, emitter doping concentrations, and feature sizes (e.g., base widths). For example, referring to the cross-section at the upper left portion of FIG. 3A, BJT 110-1A includes a corresponding set of characteristic features including a (first) collector region C1 having a (first) n-type doping level Dc1, a (first) emitter region E1 having a (first) n-type doping level De1, and a (first) base region B1 having a (first) base width Wb1. Referring to the cross-section at the lower right portion of FIG. 3A, BJT 110-2A includes a corresponding set of characteristic features including a (second) collector region C2 having a (second) n-type doping level Dc2, a (second) emitter region E2 having a (second) n-type doping level De2, and a (second) base region B2 having a (second) base width Wb2. As set forth above, the difference between cutoff frequencies $F_{T1}$ and $F_{T2}$ is achieved by constructing at least one feature of BJT 110-1A utilizing different fabrication processing parameters from those utilized to construct the corresponding feature of BJT 110-2A. For example, according to a first specific embodiment, a first n-type doping process is utilized to form collector region C1 of BJT 110-1A, and a second n-type doping process, performed before or after the first n-type doping process, is utilized to form collector region C2 of BJT 110-2A, where one or more process parameters of the first n-type doping process differs from one or more process parameters of the second doping process such that the first n-type doping process produces (first) collector region C1 with a (first) n-type doping level Dc1 that is greater than a (second) n-type doping level Dc2 of (second) collector region C2 (e.g., such that a ratio of Dc1 to Dc2 is in the range of 1.5:1 to 1000:1). In a second specific embodiment, two different n-type doping processes (which may also be utilized to form at least one of collector region C1 and C2) are utilized to respectively construct (first) emitter region E1 with a (first) n-type doping level De1 that is greater than a (second) n-type doping level De2 of (second) emitter region E2 (e.g., such that a ratio of De1 to De2 is 2:1 or more). In a third specific embodiment, two mask features having different sizes are utilized to respectively construct (first) base region B1 with a (first) width Wb1 that is smaller than a (second) width Wb2 of (second) base region B2 (e.g., such that a ratio of Wb2 to Wb1 is 2:1 or more). In other embodiments, two or more of three features mentioned above may be constructed differently (e.g., Dc1 is different from Dc2 and De1 is different from De2) to generate a suitable $F_{T1}$-to-$F_{T2}$ ratio. In yet other possible embodiments, other features of BJT 110-1A and 110-2A may be made different in order to generate a suitable $F_{T1}$-to-$F_{T2}$ ratio.

Amplifier circuits 100A1 and 100A2 differ only in that they utilize two different resistive element types, which are respectively connected between voltage source $V_{CC}$ and output node 102. Referring to BJT-based amplifier circuit 100A1 in FIG. 3A, output node 102 is coupled to (first) voltage source $V_{CC}$ by way of a suitable resistor (resistive element) R. Referring to FIG. 3B, amplifier circuit 100A2 differs from amplifier circuit 100A1 (FIG. 3A) in that an n-channel bias controlled cascade transistor 105A is utilized as a resistive element between voltage source $V_{CC}$ and output node 102. Although depicted as a MOSFET, cascade transistor 105A may alternatively be implemented using an NPN transistor. An advantage of using this cascade configuration is that this allows adjustment of the supply voltage level in order to optimize performance.

Figure 4A:
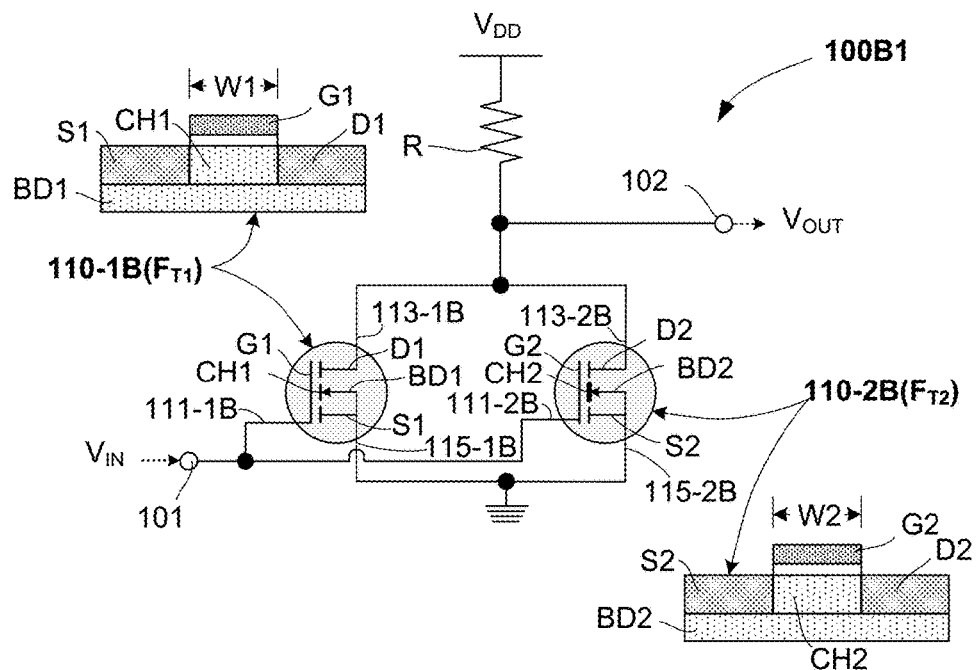
FIGS. 4A and 4B are simplified circuit diagram showing FET-based amplifiers configured in accordance with specific embodiments of the present invention.
Figure 4B:
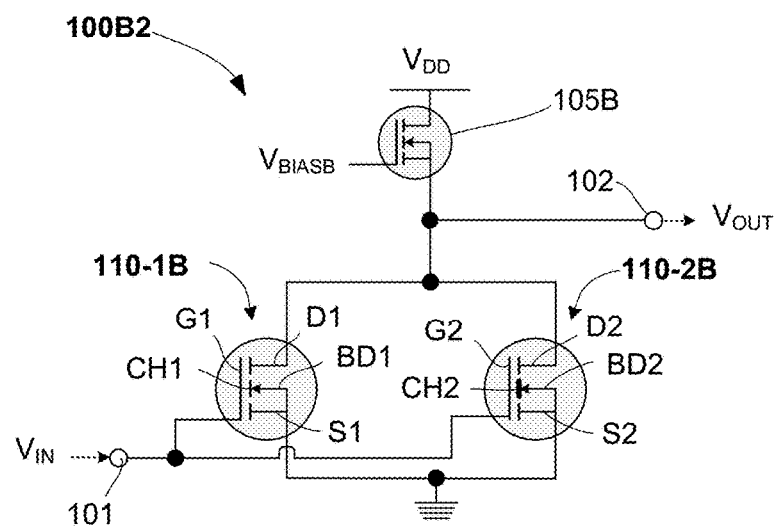

FIGS. 4A and 4B depict FET-based amplifier circuits 100B1 and 100B2 according to alternative exemplary specific embodiments in which the two transistors of amplifier circuit 100 (FIG. 1) are implemented by parallel-connected n-channel field effect transistors (FETs or MOSFETs) 110-1B and 110-2B. In both embodiments, FET 110-1B includes a (first) gate structure G1 connected by way of first control terminal 111-1B to input node 101, a (first) n-doped drain region D1 connected by way of the first output terminal 113-1B to output node 102, and a (first) n-doped source region S1 coupled to ground, and FET 110-2B includes a (second) gate structure G2 connected by way of second control terminal 111-2B to input node 101, a (second) n-doped drain region D2 connected by way of second output terminal 113-2B to output node 102, and a (second) n-doped source region S2 coupled to ground. As with the BJT-based amplifier embodiments described above with reference to FIGS. 3A and 3B, FET-based amplifier circuits 100B1 and 100B2 differ only in that they utilize two different resistive element types, where amplifier circuit 100B1 (FIG. 4A) utilizes a resistor R, and amplifier circuit 100B2 utilizes a cascode transistor 105B.

Similar to the BJT-based embodiments set forth above, FETs 110-1B and BJT 110-2B of both amplifier circuits 100B1 and 100B2 are fabricated using different feature set configurations such that cutoff frequency $F_{T1}$ of high-speed FET 110-1B is at least 1.5 times greater than cutoff frequency $F_{T2}$ of low-speed FET 110-2B. The different feature set configurations are implemented by constructing (fabricating) at least one feature of FET 110-1B using a fabrication process parameter (e.g., a doping process and/or mask configuration) that differs from that used to construct at least one corresponding feature of FET 110-2B. Referring to the cross-sectional depictions that are respectively provided in the upper left and lower right portions of FIG. 4A, exemplary feature set configurations for FET 110-1B may include source/drain/channel doping concentrations and feature sizes (e.g., channel lengths). For example, referring to the cross-section at the upper left portion of FIG. 4A, FET 110-1B includes a (first) gate structure G1 connected by way of first control terminal 111-1B to input node 101, a (first) n-doped drain region D1 connected by way of first output terminal 113-1B to output node 102, and a (first) n-doped source region S1 coupled to ground (or another low voltage source). Referring to the cross-section at the lower right portion of FIG. 4A, FET 110-2B includes a (second) gate structure G2 connected by way of second control terminal 111-2B to input node 101, a (second) n-doped drain region D2 connected by way of second output terminal 113-2B to output node 102, and a (second) n-doped source region S2 coupled to ground. As set forth above, the difference between cutoff frequencies $F_{T1}$ and $F_{T2}$ is achieved by constructing at least one feature of FET 110-1B utilizing different fabrication processing parameters from those utilized to construct the corresponding feature of FET 110-2B. In an exemplary embodiment, the higher and lower cutoff frequencies (i.e., $F_{T1}$ and $F_{T2}$, respectively) are achieved by fabricating high-speed FET 110-1B with a first channel length L1 that smaller than a second channel length L2 of low-speed n-channel FET 110-2B (e.g., such that channel length L2 is at least 10% greater than channel length L1). In other embodiments, other features of FETs 110-1B and 110-2B (e.g., doping concentrations of one or more of channels CH1 and CH2, source regions S1 and S2, or drain regions D1 and D2) may be constructed differently to generate a suitable $F_{T1}$-to-$F_{T2}$ ratio.

Figure 5:
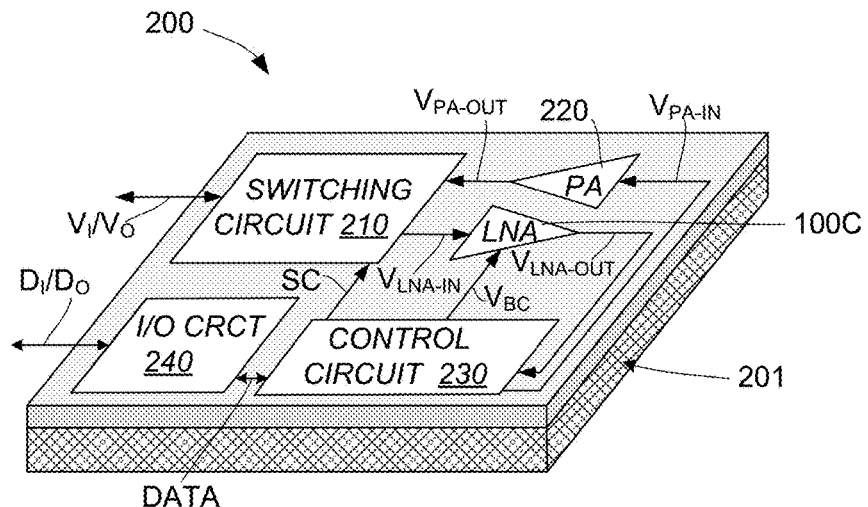
FIG. 5 is a simplified perspective view showing a communication device including a low-noise amplifier circuit produced in accordance with another practical embodiment of the present invention.

FIG. 5 depicts a simplified communication circuit 200 including both conventional communication circuitry and a low-noise amplifier (LNA) circuit 100C that are fabricated on a semiconductor (e.g., monocrystalline silicon) substrate 201 using established (e.g., CMOS, BiCMOS or SOI) fabrication techniques. For descriptive purposes, the conventional communication circuitry depicted in FIG. 5 is depicted as including a switching circuit 210, a power amplifier (PA) 220, a control circuit 230, and an I/O circuit (I/O CRCT) 240. Communication circuit 200 is characterized by performing at least data reception operations during which LNA circuit 100C generates an amplified output signal $V_{LNA-OUT}$ in response to an unamplified input signal $V_{LNA-IN}$ received, for example, from switching circuit 210. In one embodiment, switching circuit 210 is controlled by way of a control signal SC, which is generated by control circuit 230, to generate unamplified input signal $V_{LNA-IN}$ in response to an input signal $V_I$ during data reception operating modes, where input signal $V_I$ may be received from a suitable external source (e.g., an antenna, microphone or transmission line), and to generate an output signal $V_O$ in response to a power amplifier output signal $V_{PA-OUT}$ received from power amplifier 220 during data transmission operating modes. Control circuit 230 processes/converts amplified output signal $V_{LNA-OUT}$ received from LNA circuit 100C during data reception operating modes into corresponding data, which may then be transmitted from communication circuit 200 as output data $D_O$ by way of I/O circuit 240. Control circuit 230 may also process/convert data that may be transmitted to communication circuit 200 as input data $D_I$ by way of I/O circuit 240, and may generate a corresponding power amplifier input signal $V_{PA-IN}$ that is supplied to power amplifier 220 during data transmission operating modes. In one practical embodiment, communication circuit 200 is configured for use on a cell phone or other portable electronic device.

Figure 6:
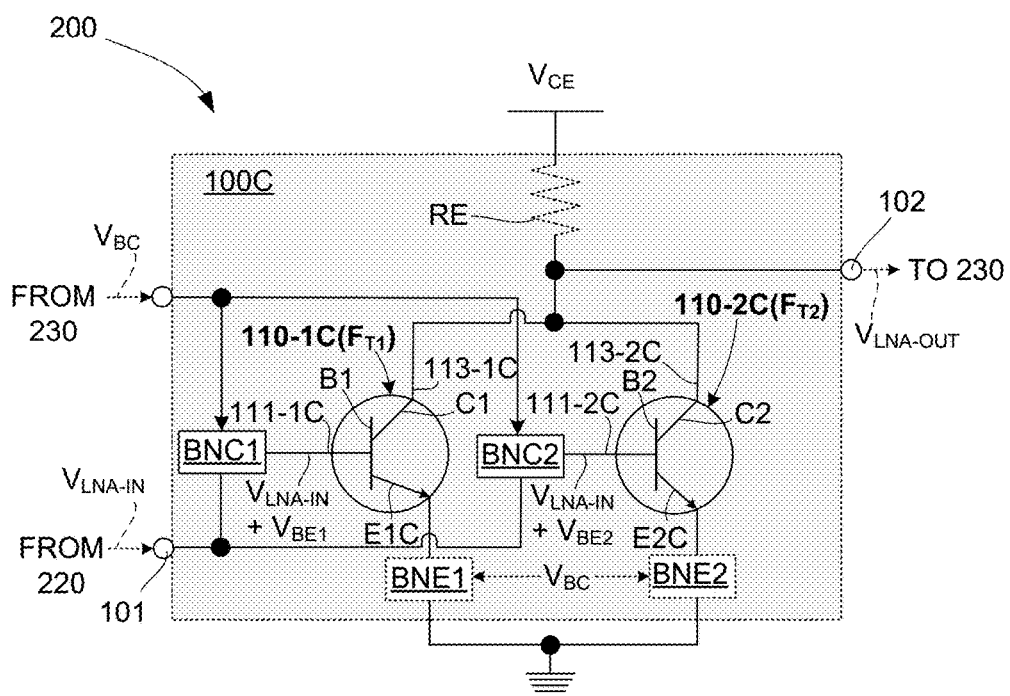
FIG. 6 is a simplified circuit diagram showing an exemplary low-noise amplifier circuit utilized in the communication device of FIG. 5 in additional detail.

FIG. 6 depicts a portion of communication circuit 200 (see FIG. 5) that includes LNA circuit 100C. LNA circuit 100C is configured similar to the amplifier circuit described above with reference to FIGS. 3A to 4B in that LNA circuit 100C includes a npn BJT (first transistor) 110-1C having a (first) control terminal 111-1C coupled to input node 101 and a (first) output terminal 113-1C coupled to the output node 102, and a npn BJT (second transistor) 110-2C having a (second) control terminal 111-2C coupled to input node 101 and a (second) output terminal 113-2C coupled to output node 102, where BJTs 110-1C and 110-2C are operably respectively configured such that cutoff frequency $F_{T1}$ is at least 1.5 times greater than cutoff frequency $F_{T2}$.

LNA circuit 100C differs from the earlier embodiments in that it further includes bias circuitry configured to apply at least one bias voltage onto either one or both control terminals of BJTs 110-1C or 110-2C, or onto one or both emitter terminals of BJTs 110-1C or 110-2C. In a presently preferred embodiment, a (first) bias network circuit BNC1 is coupled between input node 101 and (first) control terminal 111-1C of BJT 110-1C, and a (second) bias network circuit BNC2 is coupled between input node 101 and (second) control terminal 111-1C of BJT 110-2C. Bias network circuits BNC1 and BNC2 are controlled by a bias control signal $V_{BC}$, which is generated by control circuit 230 (see FIG. 5), such that bias network circuit BNC1 modifies input signal $V_{LNA-IN}$ that is applied to (first) control terminal 111-1C to include a (first) bias voltage $V_{BE1}$, and such that bias network circuit BNC2 modifies input signal $V_{LNA-IN}$ that is applied to (second) control terminal 111-2C to include a (second) bias voltage $V_{BE2}$. That is, the base voltage applied to base B1 of BJT 110-1C includes both input signal $V_{LNA-IN}$ and (first) bias voltage $V_{BE1}$ (i.e., $V_{LNA-IN}+V_{BE1}$), and the base voltage applied to base B2 of BJT 110-2C includes both input signal $V_{LNA-IN}$ and (second) bias voltage $V_{BE2}$ (i.e., $V_{LNA-IN}+V_{BE2}$). Those skilled in the art will recognize that this configuration facilitates optimization of the gain, noise and linearity performance of amplifier circuit 100C. In an alternative embodiment (not shown), only one of bias control circuits BNC1 and BNC2 are utilized to apply a bias voltage to the control terminal of only one of BJT 110-1C and BJT 110-2C. In another alternative embodiment, bias control circuits BNC1 and BNC2 are omitted, and one or more of optional bias control circuits BNE1 and BNE2 (shown in dashed lines at the bottom of FIG. 6) are respectively coupled between the emitter terminals of BJTs 110-1C and 110-2C and ground. In one embodiment, a first bias network circuit BNE1 is coupled between (first) emitter terminal E1C of BJT (first transistor) 110-1C and ground, and a (second) bias network circuit BNE2 is coupled between (second) emitter terminal E2C of BJT (second transistor) 110-2C and ground, where both bias network circuits BNE1 and BNE2 receive bias control signal $V_{BC}$.

Figure 7:
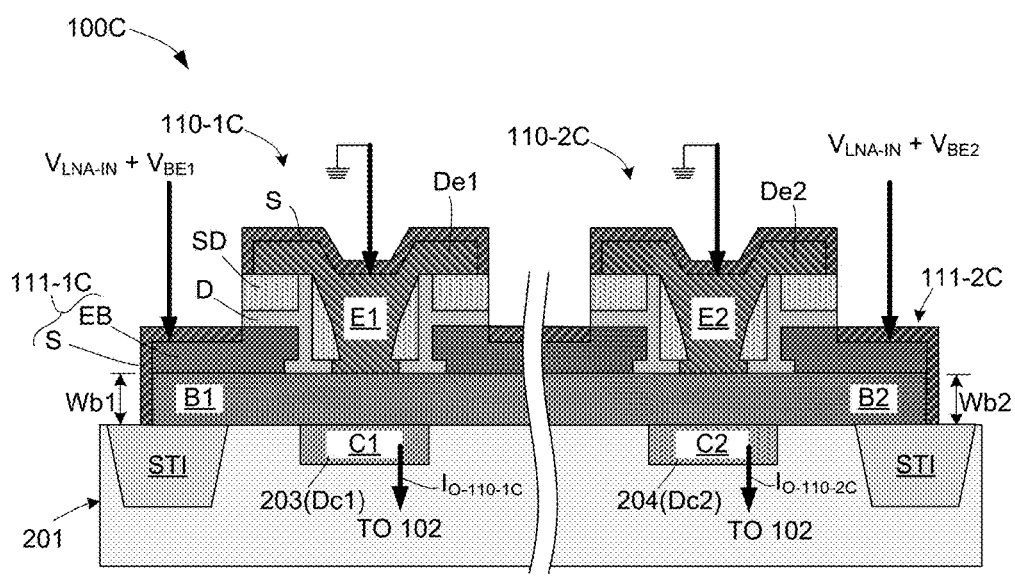
FIG. 7 is a cross-sectional side view showing two BJT transistors utilized in the low-noise amplifier circuit of FIG. 6 according to a specific embodiment of the present invention.

FIG. 7 shows exemplary BJTs 110-1C and 110-2C utilized in amplifier circuit 100C (FIG. 6) according to an exemplary specific embodiment. Both BJTs 110-1C and 110-2C are formed on substrate 201, and are isolated from adjacent circuit elements by way of shallow-trench isolation (STI) structures. BJT 110-1C includes a (first) p-doped polycrystalline silicon or silicon-germanium (SiGe) base structure (region) B1 formed between a diffused (first) n-doped control region C1 and a (first) n-doped polycrystalline silicon emitter structure (region) E1, where control region C1 resides in a portion 203 of substrate 201, and where a control terminal 111-1C is formed by an extrinsic base structure EB covered by a silicide S and separated from emitter structure E1 by oxide-based dielectric structures D and nitride or α-Si spacer depositions SD. Similarly, BJT 110-2C includes a (second) p-doped polycrystalline silicon or SiGe base region B2 formed between a diffused (second) n-doped control region C2 and a (second) n-doped polycrystalline silicon emitter structure (region) E2, where control region C2 resides in a portion 204 of substrate 201, and where control terminal 111-2C is constructed in a manner similar to that described above with reference to control terminal 111-1C. With this configuration, biased input signal $V_{LNA-IN}+V_{BE1}$ is applied to base region B1 of BJT 110-1C by way of control terminal 111-1C, and BJT 110-1C outputs signal $I_{O-110-1C}$ to output node 102 by way of n-doped control region C1, and biased input signal $V_{LNA-IN}+V_{BE2}$ is applied to base region B2 of BJT 110-2C by way of control terminal 111-2C, and BJT 110-2C outputs signal $I_{O-110-2C}$ to output node 102 by way of n-doped control region C2. To achieve the desired cutoff frequency ratio $F_{T1}$ to $F_{T2}$, a n-type doping concentration Dc1 of diffused collector region C1 is greater than a doping concentration Dc2 of diffused collector region C2 (e.g., such that a ration of Dc1 to Dc2 is 1.5:1 or greater). As explained above, the desired cutoff ratio may also be achieved by way of fabricating emitter structure E1 with a n-type doping concentration De1 that is greater than n-type doping concentration De2 of emitter structure E2, and/or by forming base structure B1 with a shorter base width Wb1 than corresponding base width Wb2 of base structure B2.

Although the present invention has been described with respect to certain specific embodiments, it will be clear to those skilled in the art that the inventive features of the present invention are applicable to other embodiments as well, all of which are intended to fall within the scope of the present invention. For example, although the amplifier circuit of the present invention is primarily intended for communication circuits (both wireless and wireline), which arguably benefit the most from the higher $IIP_3$ (i.e., improved linearity) provided by the novel approach by way of minimizing interference between channels, the inventors believe the improved linearly of amplifiers generated in accordance with the present invention may be beneficially used in other applications as well (e.g., medical devices and other instrumentation). Accordingly, unless otherwise specified, the claims should not be limited to communication circuits.

The invention claimed is:

1. An amplifier circuit for generating an amplified output signal on an output node in response to an unamplified input signal received at an input node, the amplifier circuit comprising:
   a first transistor having a first control terminal coupled to the input node and a first output terminal coupled to the output node, the first transistor being operably configured to have a first cutoff frequency; and
   a second transistor having a second control terminal coupled to the input node and a second output terminal coupled to the output node, the second transistor being operably configured to have a second cutoff frequency,
   wherein the first and second transistors are configured such that the first cutoff frequency is at least 1.5 times greater than the second cutoff frequency,
   wherein the output node is coupled to a first voltage source by way of a resistive element,
   wherein the first transistor comprises a first npn bipolar junction transistor (BJT) having a first p-doped base region connected to the input node, a first n-doped collector region connected to the output node, and a first n-doped emitter region coupled to a second voltage source, and
   wherein the second transistor comprises a second npn BJT having a second base region connected to the input node, a second n-doped collector region connected to the output node, and a second n-doped emitter region coupled to the second voltage source.

2. The amplifier circuit of claim 1, wherein the first and second transistors are configured such that a ratio of the first cutoff frequency to the second cutoff frequency is in the range 1.5:1 to 20:1.

3. The amplifier circuit of claim 2, wherein the first and second transistors are configured such that the ratio of the first cutoff frequency to the second cutoff frequency is in the range of 2:1 to 5:1.

4. The amplifier circuit of claim 1, wherein a first n-type doping level of the first collector region of the first BJT is greater than a second n-type doping level of the second collector region of the second BJT.

5. The amplifier circuit of claim 1, wherein a first n-type doping level of the first emitter region of the first BJT is greater than a second n-type doping level of the second emitter region of the second BJT.

6. The amplifier circuit of claim 1, wherein a first width of the first base region of the first BJT is less than a second width of the second base region of the second BJT.

7. An amplifier circuit for generating an amplified output signal on an output node in response to an unamplified input signal received at an input node, the amplifier circuit comprising:
   a first transistor having a first control terminal coupled to the input node and a first output terminal coupled to the output node, the first transistor being operably configured to have a first cutoff frequency; and
   a second transistor having a second control terminal coupled to the input node and a second output terminal coupled to the output node, the second transistor being operably configured to have a second cutoff frequency,
   wherein the first and second transistors are configured such that the first cutoff frequency is at least 1.5 times greater than the second cutoff frequency,
   wherein the output node is coupled to a first voltage source by way of a resistive element,
   wherein the first transistor comprises a first n-channel field effect transistor (FET) having a first gate structure connected to the input node, a first n-doped drain region connected to the output node, and a first n-doped source region coupled to a second voltage source,
   wherein the second transistor comprises a second n-channel field effect transistor (FET) having a second gate structure connected to the input node, a second n-doped drain region connected to the output node, and a second n-doped source region coupled to the second voltage source, and
   wherein a first channel length of the first n-channel FET is less than a second channel length of the second n-channel FET.

8. An amplifier circuit for generating an amplified output signal on an output node in response to an unamplified input signal received at an input node, the amplifier circuit comprising:
   a first transistor having a first control terminal coupled to the input node and a first output terminal coupled to the output node, the first transistor being operably configured to have a first cutoff frequency;
   a second transistor having a second control terminal coupled to the input node and a second output terminal coupled to the output node, the second transistor being operably configured to have a second cutoff frequency; and
   at least one of a first bias network circuit coupled between a first emitter terminal of the first transistor and the second voltage source, and a second bias network circuit coupled between a second emitter terminal of the second transistor and the second voltage source,
   wherein the first and second transistors are configured such that the first cutoff frequency is at least 1.5 times greater than the second cutoff frequency.

9. The amplifier circuit of claim 8, further comprising means for applying a bias voltage onto at least one of the first control terminal of the first transistor and the second control terminal of the second transistor.

10. The amplifier circuit of claim 9, wherein said means comprises at least one of a first bias network circuit coupled between the input node and the first control terminal of the first transistor, and a second bias network circuit coupled between the input node and the second control terminal of the second transistor.

11. The amplifier circuit of claim 10, wherein said first bias network circuit and said second bias network circuit are configured to apply said bias voltage onto the first control terminal of the first transistor and the second control terminal of the second transistor.

12. An amplifier circuit for generating an amplified output signal on an output node in response to an unamplified input signal received at an input node, the amplifier comprising:

a first bipolar junction transistor (BJT) having a first base region coupled to the input node, a first collector region coupled to the output node, and a first emitter region coupled to a ground potential;

a second BJT having a second base region coupled to the input node, a second collector region coupled to the output node, and a second emitter region coupled to the ground potential, wherein the first base region, the first emitter region and the first collector region are respectively operably configured such that the first BJT has a first cutoff frequency, wherein the second base region, the second emitter region and the first collector region are respectively operably configured such that the second BJT has a second cutoff frequency, and wherein the first and second BJTs are respectively configured such that a ratio of the first cutoff frequency to the second cutoff frequency is in the range of 1.5:1 to 20:1.

13. The amplifier circuit of claim 12, wherein a first n-type doping level of the first collector region of the first BJT is greater than a second n-type doping level of the second collector region of the second BJT.

14. The amplifier circuit of claim 12, wherein a first n-type doping level of the first emitter region of the first BJT is greater than a second n-type doping level of the second emitter region of the second BJT.

15. The amplifier circuit of claim 12, wherein a first width of the first base region of the first BJT is less than a second width of the second base region of the second BJT.

16. The amplifier circuit of claim 12, further comprising means for applying a bias voltage onto at least one of the first base region of the first BJT, the first emitter region of the first BJT, the second base region of the second BJT, and the second emitter region of the second BJT.

17. A communication circuit fabricated on a semiconductor substrate and including a low-noise amplifier (LNA) circuit configured to generate an amplified output signal in response to an unamplified input signal, wherein the LNA circuit comprising:

an input node configured to receive the input signal;

an output node coupled to a first voltage supply;

a first transistor having a first control terminal coupled to the input node and a first output terminal coupled to the output node, the first transistor being operably configured to have a first cutoff frequency; and a second transistor having a second control terminal coupled to the input node and a second output terminal coupled to the output node, the second transistor being operably configured to have a second cutoff frequency, wherein the first and second transistors are configured such that the first cutoff frequency is at least 1.5 times greater than the second cutoff frequency, wherein the output node is coupled to a first voltage source by way of a resistive element, wherein the first transistor comprises a first npn bipolar junction transistor (BJT) having a first p-doped base region connected to the input node, a first n-doped collector region connected to the output node and a first n-doped emitter region coupled to a second voltage source, and wherein the second transistor comprises a second npn BJT having a second p-doped base region connected to the input node, a second n-doped collector region connected to the output node, and a second n-doped emitter region coupled to the second voltage source.

* * * * *